United States Patent
Hunt-Schroeder et al.

(10) Patent No.: US 11,418,195 B1
(45) Date of Patent: Aug. 16, 2022

(54) VOLTAGE POWER SWITCH

(71) Applicant: Marvell Asia Pte, Ltd., Singapore (SG)

(72) Inventors: Eric D. Hunt-Schroeder, Essex Junction, VT (US); Darren Anand, Williston, VT (US); Michael Roberge, Milton, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/376,473

(22) Filed: Jul. 15, 2021

Related U.S. Application Data

(60) Provisional application No. 63/052,350, filed on Jul. 15, 2020.

(51) Int. Cl.
| | |
|---|---|
| *G11C 5/00* | (2006.01) |
| *G11C 5/14* | (2006.01) |
| *H03K 19/00* | (2006.01) |
| *H03K 19/0185* | (2006.01) |
| *G06F 1/06* | (2006.01) |
| *H03K 19/20* | (2006.01) |
| *H03K 3/037* | (2006.01) |

(52) U.S. Cl.
CPC ....... *H03K 19/018521* (2013.01); *G06F 1/06* (2013.01); *H03K 3/037* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 7,521,987 B1* | 4/2009 | Cullen | H03K 19/17744 327/407 |
| 8,154,942 B1* | 4/2012 | Xiao | G11C 17/18 365/96 |
| 2022/0050737 A1* | 2/2022 | Sakamoto | G11C 7/227 |

* cited by examiner

*Primary Examiner* — Kenneth B Wells

(57) ABSTRACT

A voltage power switch includes circuitry configured to output a known voltage. The voltage power switch includes a lock circuit configured to output a known state and a voltage level shifter configured to receive an input, the input being based on the known state output by the lock circuit. The voltage power switch, using an output circuit, is configured to output a known voltage level based on an output of the voltage level shifter, wherein the known voltage is one of a high voltage $V_{HI}$ for a fuse programing period or a first non-zero intermediate voltage $V_{MID1}$ for a non-fuse programming period.

20 Claims, 5 Drawing Sheets

US 11,418,195 B1

VOLTAGE POWER SWITCH

CROSS REFERENCE TO RELATED APPLICATIONS

This disclosure claims the benefit of commonly-assigned U.S. Provisional Patent Application No. 63/052,350, filed Jul. 15, 2020, which is hereby incorporated by reference herein in its entirety.

FIELD OF USE

This disclosure relates to methods and systems for programming of electronic fuses in semiconductor devices. More particularly, this disclosure relates to on-chip circuitry for a voltage power switch which selectively provides a high voltage for a short duration during fuse programming.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

The semiconductor industry has progressed into nanometer technology process nodes in pursuit of higher device density, higher performance, and lower costs. More recently, the International Roadmap for Devices and System has defined the 5 nm process as the metal-oxide-semiconductor field-effect transistor (MOSFET) technology node. However, advances in semiconductor technologies scaling also have limited the voltages tolerated by such semiconductor devices. For example, the 5 nm process nodes only support devices (e.g., transistors) operating at very low voltages. However, higher voltages are required to blow a fuse link for fuse programming of non-volatile memory. However, providing a voltage higher than the specified operating voltages for long durations may damage the additional components of the Integrated Circuit (IC). With expected advancement towards a 3 nm process node and beyond, the voltages tolerated by the components are expected to continue to be low. Accordingly, there is a need to provide a voltage switch with a known power up state that allows for selective passing of higher voltages for short durations during fuse programming without violating any terminal to terminal voltage limits on the Integrated Circuits.

SUMMARY

According to implementations of the subject matter of this disclosure, a voltage power switch outputs a known voltage. The voltage power switch includes a lock circuit configured to output a known state and a voltage level shifter configured to receive an input, the input being based on the known state output by the lock circuit. The voltage power switch, using an output circuit, is configured to output a known voltage level based on an output of the voltage level shifter, wherein the known voltage is one of a high voltage $V_{HI}$ for a fuse programing period or a first non-zero intermediate voltage $V_{MID1}$ for a non-fuse programming period.

In a first implementation of the voltage power switch, the voltage level shifter is configured to output the high voltage $V_{HI}$ when the known state output by the lock circuit is a first state, and wherein the voltage level shifter is configured to output a second non-zero intermediate voltage $V_{MID2}$ when the known state output by the lock circuit is a second state.

According to a first aspect of that first implementation, the output circuit comprises of a NMOS transistor and a PMOS transistor and the NMOS transistor and the PMOS transistor are each biased by an output of the voltage level shifter.

A first instance of that first aspect of that first implementation may further include the output circuit being configured to (i) output the high voltage $V_{HI}$ when the output from the voltage level shifter is the second non-zero intermediate voltage $V_{MID2}$ and (ii) output the first non-zero intermediate voltage $V_{MID1}$ when the output from the voltage level shifter is the high voltage $V_{HI}$.

A second instance of that first aspect of that first implementation may further include the first non-zero intermediate voltage $V_{MID1}$ being higher than the second non-zero intermediate voltage $V_{MID2}$ and is lower than the high voltage $V_{HI}$.

According to a second aspect of that first implementation, the lock circuit includes N latches cascaded in series, wherein N is an integer greater than 1. The lock circuitry further includes a reset pulse generator configured to force the N latches into a known locked state.

A first instance of that second aspect of that first implementation includes the lock circuit being unlocked by pulsing a clock signal N times.

A second instance of that second aspect of that first implementation includes the lock circuit outputting the first state when the N cascaded latches are in a locked state, and outputting the second state when the N cascaded latches are in an unlocked state.

In a second implementation of the voltage power switch, the voltage level shifter includes a first stage power-up level shifter configured to receive a low voltage $V_{LO}$ as an input and output the second non-zero intermediate voltage $V_{MID2}$. The voltage level shifter in accordance with the second implementation further includes a second stage power-up level shifter configured to receive the second non-zero intermediate voltage $V_{MID2}$ as an input and output the high voltage $V_{HI}$.

In a third implementation of the voltage power switch, the voltage power switch further includes a digital logic AND gate configured to receive as an input: (i) the known state output from the lock circuit; (ii) a low voltage $V_{LO}$; and (iii) a user generated signal indicative of a fuse programming request.

According to a first aspect of that third implementation, the voltage level shifter is configured to output the high voltage $V_{HI}$ when the digital logic AND gate is output "LOW" and the voltage level shifter is configured to output a second non-zero intermediate voltage $V_{MID2}$ when the digital logic AND gate is output "HIGH".

In a fourth implementation of the voltage power switch, the voltage power switch further includes an external reset block configured to generate a reset signal to lock the lock circuit.

A method according to implementation of the subject matter of this disclosure, for outputting a known high voltage for fuse programming, includes generating a reset pulse configured to force a lock circuit into a known locked state, generating a predefined clock signal sequence to unlock the lock circuit, where the output of the lock circuit, when in the unlocked state, is a "HIGH" state, inputting the output of the lock circuit into a digital logic AND gate, receiving a user input signal SELECTH at the digital logic AND gate, in response to receiving the user input signal SELECTH and the "HIGH" state output of the lock circuit, outputting a non-zero intermediate voltage $V_{MID2}$ using a voltage level shifter, and providing the voltage level shifter output $V_{MID2}$ as a gate voltage to bias a pair of transistors in order to output the known high voltage $V_{HI}$ for fuse programming.

In a first implementation of such a method, the lock circuit comprises N latches cascaded in series, where unlocking the lock circuit comprises propagating N clock pulses through the lock circuit.

In a second implementation of such a method, the known high voltage $V_{HI}$ is output for a short duration.

A method according to implementation of the subject matter of this disclosure, for outputting a known sage voltage level, includes generating a reset pulse configured to force a lock circuit into a known locked state, where the output of the lock circuit, when in the locked state, is a first "LOW" state, inputting the output of the lock circuit into a digital logic AND gate such that the digital logic AND gate outputs a "LOW" state independent of additional inputs to the digital logic AND gate, outputting a high voltage $V_{HI}$ using a voltage level shifter in response to receiving an output "LOW" from the digital logic AND gate, and providing the voltage level shifter output $V_{HI}$ as a gate voltage to bias a pair of transistors in order to output the known safe voltage.

In a first implementation of such a method, the additional inputs to the digital logic AND gate are unknown.

In a first aspect of that first implementation of such a method, the additional inputs to the digital logic AND gate includes a power-on voltage.

In a second implementation of such a method, the lock circuit includes N latches cascaded in series, where the N latches remain in a locked state until receiving N number of clock pulses.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Prior to the development of the 5 nm process nodes (e.g., 10 nm process nodes), Integrated circuits (ICs) included transistors that supported higher voltages (e.g., 1.8V). However, advances in semiconductor technologies scaling also have limited the voltages at which the transistors on such devices can operate. For example, the 5 nm process nodes only support devices (e.g., transistors) operating at 1.2V or 1.5V. However, these ICs still require higher voltages (e.g., 1.8V) for fuse programming. Accordingly, there is a need to selectively provide higher voltages for a short duration during a fuse programming mode while outputting a safe voltage during non-fuse programming mode.

The subject matter of this disclosure may be better understood by reference to FIGS. 1-5.

Figure 1:
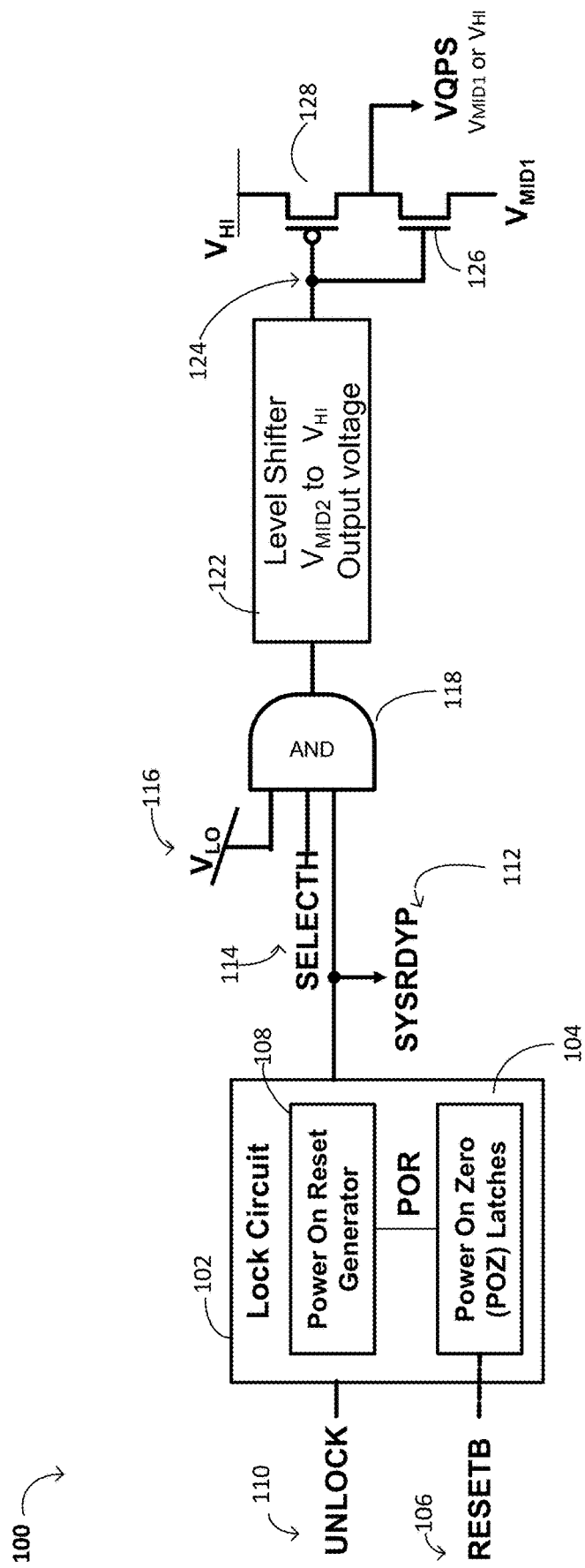
FIG. 1 is a block diagram of voltage power switch in accordance with implementations of the subject matter of this disclosure for regulating voltage supplied to an Integrated circuit.

FIG. 1 is a block diagram of a voltage power switch 100 in accordance with implementations of the subject matter of this disclosure for regulating voltage supplied to an Integrated circuit.

Voltage power switch 100 provides a mechanism for selectively providing a known power up state that allows for passing of high voltages during the fuse-programming period without violating any terminal to terminal voltage limits, in accordance with embodiments discussed herein. Specifically, voltage power switch 100 is configured to selectively output a high voltage during a fuse programming period while outputting an intermediate non-zero voltage that is safe for the components of the IC during a non-fuse programming mode.

Figure 2:
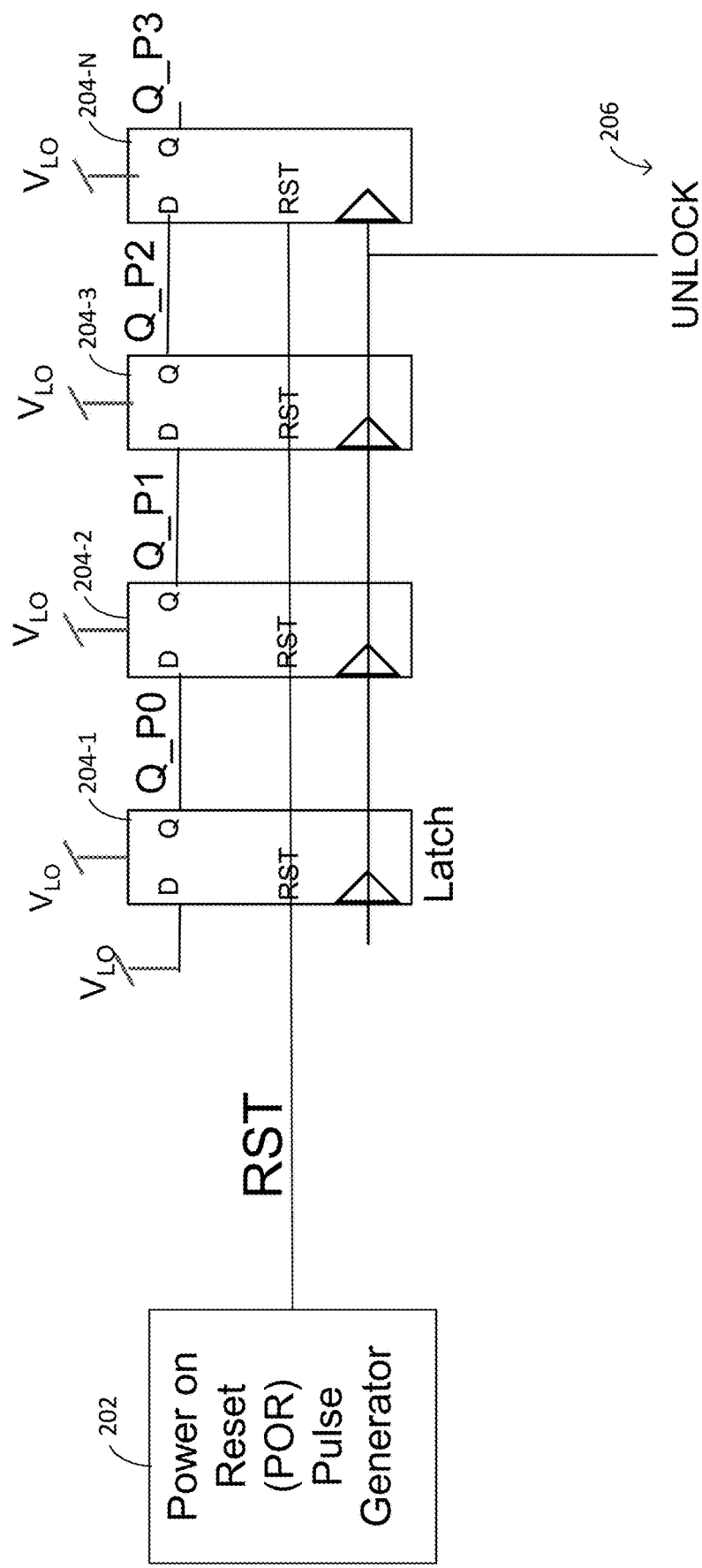
FIG. 2 is a schematic representation of a lock circuit in accordance with implementations of the subject matter of this disclosure.

As illustrated in FIG. 1, voltage power switch 100 includes a lock circuit 102 which includes a power-on-reset generator 108 and power-on-zero latches 104. The lock circuit 102 serves to protect the voltage power switch 100 from outputting a high voltage during a non-fuse programming period as will be described below. Specifically, in one embodiment, lock circuit 102 includes N number of cascaded power-on-zero latches 104, where N is greater than zero. For example, in one embodiment, lock circuit 102 includes four cascaded power-on-zero latches 104 (as shown in the embodiment of FIG. 2). Power-on-reset generator 108 generates a reset pulse (RESETB 106) which forces a known locked state into the N number of power-on-zero latches 104. During the non-fuse programming period, the lock circuit 102 remains in a locked state ensuring that an output logic SYSRDYP 112 from lock circuit 102 remains "0" until all the power-on-zero latches 104 are unlocked. An unlock procedure for unlocking the N number of power-on-zero latches 104 is described below in connection with the discussion of FIG. 3.

By ensuring the output logic SYSRDYP 112 from lock circuit 102 remains "0" until the lock circuit 102 is unlocked, voltage power switch 100 statistically guarantees a known input into the voltage level shifter 122. Specifically, as shown in FIG. 1, lock circuit output SYSRDYP 112 is combined with an unknown input signal SELECTH 114 (often provided by a System-on-Chip logic component) and a low voltage $V_{LO}$ 116 and fed into an AND gate 118. Accordingly, the input to the voltage level shifter 122 remains a logic "0" until the lock circuit 102 is unlocked by following the unlocking procedure outlined in FIG. 3 (described below). Therefore, lock circuit 102 maintains a known input to the voltage level shifter 122 despite both input signal SELECTH 114 and low voltage $V_{LO}$ 116 being of unknown values.

The voltage level shifter 122, in response to receiving a "0" input during the non-fuse programming mode (i.e., while the lock circuit 102 remains locked), serves to shift the voltage up to a high voltage $V_{HI}$. In another embodiment, the voltage level shifter 122, in response to receiving a "1" input during the non-fuse programming mode (i.e., while the lock circuit 102 remains locked), serves to shift the voltage up to a second intermediate voltage level $V_{MID2}$. In an aspect, the second intermediate voltage level $V_{MID2}$ is a non-zero voltage that is lower than the first intermediate voltage level $V_{MID1}$. In one example where the first intermediate voltage level $V_{MID1}$ is 1.2V, the second intermediate voltage level $V_{MID2}$ is 0.6V. In an embodiment, voltage level shifter 122 includes a plurality of cascaded voltage level shifters where a first stage voltage level shifter is configured to shift the voltage from a zero voltage to the second intermediate voltage level $V_{MID2}$ and a second stage voltage level shifter is configured to shift the voltage from the second intermediate voltage level $V_{MID2}$ to the high voltage $V_{HI}$. Operation and structure of voltage level shifter 122 is described in greater detail below in connection with the discussion of FIG. 4.

Accordingly, during the non-fuse programming mode, voltage level shifter 122 outputs a known voltage $V_{HI}$ to gate 124 of an N-channel Field Effect Transistor (NFET) 126 and a P-channel Field Effect Transistor (PFET) 128. Although FIG. 1 shows a single NFET 126 and PFET 128, various implementations can include any number of arrays of such transistor devices. In accordance with an embodiment, when the gate voltage at gate 124 is $V_{HI}$, the NFET 126 is turned ON as its gate-source junction is positively biased while the PFET 128 switches OFF. Therefore, a voltage VQPS equal to the first intermediate voltage $V_{MID1}$ is output in this configuration. In accordance with embodiments of the subject matter of this disclosure, the first intermediate voltage $V_{MID1}$ is less than the high voltage $V_{HI}$ and is safe for all transistor devices to operate at. Accordingly, in this way, voltage power switch 100 ensures a safe voltage (first intermediate voltage $V_{MID1}$) is output during a non-fuse programming period.

Next, operation of the voltage power switch 100 is discussed during a fuse programming period. First, the N number of cascaded power-on-zero latches 104 receive the unlock signal 110 (e.g., a clock pulse) to unlock each of the N number of cascaded power-on-zero latches 104. Specifically, the latches 104 are sequentially unlocked after N number of clock pulses are registered. For example, conventional systems often use a single latch which may erroneously register a clock pulse and unlock therefore resulting in a high voltage being propagated through the semiconductor device. In contrast, methods and systems disclosed herein provide a cascaded structure of the N-number of latches which statistically guarantees that the latches are not unlocked due to a glitch.

Once all of the N number of latches 104 are unlocked, lock circuit 102 outputs a "1" at SYSRDYP 112. SYSRDYP 112 is combined with a "HIGH" SELECTH 114 signal (indicative of a fuse programming mode) and a powered on $V_{LO}$ 116 so that AND gate 118 outputs a "1". Voltage level shifter 122, in response to receiving a "1" input from AND gate 118, outputs the second intermediate voltage $V_{MID2}$. When the gate voltage at gate 124 is the second intermediate voltage $V_{MID2}$, PFET 128 is switched ON and only the high voltage $V_{HI}$ is output at VQPS and is used to program the fuse for a short duration.

Although the above description describes use of a digital logic AND gate, a person skilled in the art will understand that a digital logic NAND gate may be used instead. For example, the output from the lock circuit 102 may be input to an inverter prior to being input into the digital logic NAND gate.

Accordingly, voltage power switch 100 controls the output voltage VQPS such that an output voltage VQPS is a high voltage $V_{HI}$ when in a fuse programming mode and is a safe first intermediate voltage $V_{MID1}$ when in a non-fuse programming mode. Specifically, voltage power switch 100 uses the lock circuit 102 to generate a known input into the voltage level shifter 122, which in turn generates a known output gate voltage. The known output gate voltage at gate 124 is then used to drive the NFET 126 and PFET 128 to output desired voltages VQPS.

FIG. 2 is a schematic representation of a lock circuit 102 in accordance with implementations of the subject matter of this disclosure. As shown in FIG. 2, the lock circuit 102 includes a power-on-reset (POR) pulse generator 202 and N number of latches 202-1, 202-2, 202-3, . . . , 202-N (collectively 204). Although the embodiment illustrated in FIG. 2 shows a total of four latches, a person skilled in the art will understand that any number of latches may be provided to statistically guarantee a locked state until the correct unlock sequence is received. For example, in one embodiment, the lock circuit includes a total of two cascaded latches.

When the IC is powered up initially, POR pulse generator 202 generates a reset signal RST that puts the latches 204 in a locked state. In an embodiment, an external asynchronous reset pulse may be provided to the lock circuit in order to reset the N latches into a locked state. An unlock signal 206 (e.g., a clock signal) unlocks the N latches by propagating N number of pulses through the lock circuit. In an embodiment, the output of the lock circuit SYSRDYP is obtained by combining the output of each of the N latches using a digital logic AND gate. Accordingly, the lock circuit continues to be in a locked state (i.e., the output SYSRDYP continues to be in "LOW" output) until every latch of the N latches is unlocked. Once N number of pulses are registered and the corresponding N latches are unlocked, the output SYSRDYP provides a "HIGH" output. This procedure therefore prevents a false unlocking of the lock circuit. For example, when only a single latch is used in the lock circuit, a glitch may be registered as a clock pulse, thereby unlocking the lock circuit erroneously. As discussed above, such an error would result in a high voltage beyond the safe limits of the semiconductor device being provided for a prolonged duration, thereby damaging the semiconductor device. Accordingly, the additional redundancies provided in the embodiment of FIG. 2 statistically guarantees prevention of such a false unlock.

Figure 3:
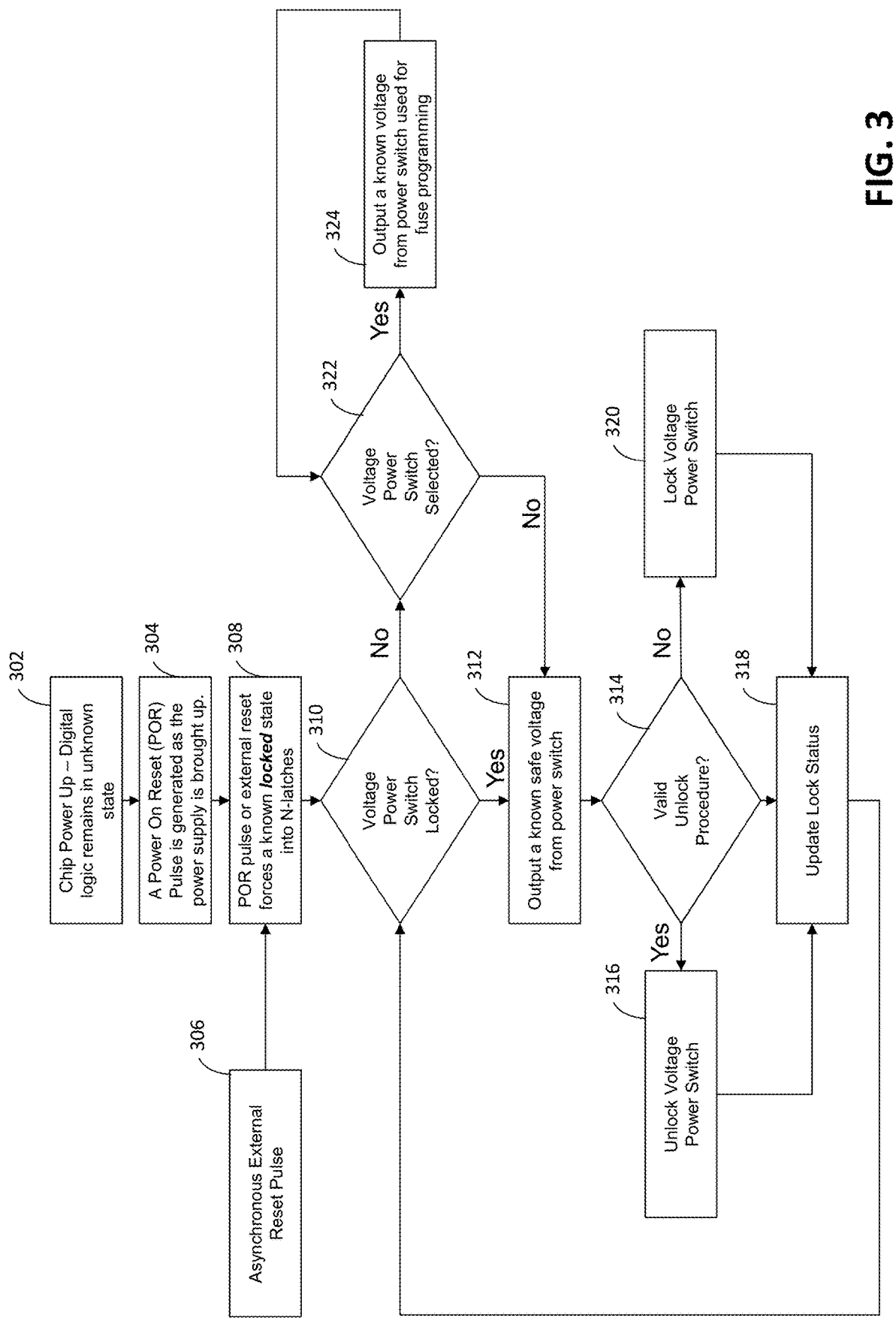
FIG. 3 is a flowchart illustrating a method of unlocking the lock circuit in accordance with implementations of the subject matter of this disclosure.

FIG. 3 is a flowchart illustrating a method of unlocking the lock circuit in accordance with implementations of the subject matter of this disclosure. At 302, as the IC is powered up, the digital logic remains in an unknown state. In other words, the input voltages to the IC are unknown and therefore unsafe for the devices (e.g., various transistors that cannot operate at voltages higher than a predefined safe voltage level) of the IC to operate at. At 304, a power-on-reset (POR) pulse generator generates a pulse as the unknown power supply is being brought up. Alternatively, or in addition to the POR pulse generator, an asynchronous external reset pulse is also generated at 306.

At 308, the POR pulse and/or the external reset pulse force a known locked state into the N latches of the lock circuit. This guarantees that the unknown power supply being brought up does not propagate through the IC until the lock circuit is safely unlocked. At 310, the system determines whether the voltage power switch is unlocked. As discussed above, during initial power-up sequence, the voltage power switch is locked because of the POR pulse and/or the external reset pulse force.

If at 310, it is determined that the voltage power switch is in a locked state (YES at 310), the process proceeds to 312 where the voltage power switch outputs a known safe voltage regardless of the unknown power supply voltage. As discussed above in connection with FIG. 1, while the voltage power switch is locked, the lock circuit output SYSRDYP remains output "LOW" which in turn causes the output of the voltage power switch to be the safe voltage $V_{MID1}$. The process then proceeds to 314, where the system determines a valid unlock procedure has been performed. For example, the system determines whether an N number of pulses corresponding to the N latches have been received.

If it is determined that the valid unlock procedure has been performed (YES at 314), the process proceeds to 316 and the voltage power switch is unlocked. At 318, the lock status of the voltage power switch is updated to an unlocked status. If, on the other hand, it is determined that the valid unlock procedure has not been performed (NO at 314), the process proceeds to 320 and the voltage power switch remains in a locked state. The lock status is updated at 318 and the process returns to 310.

If, at 310, it is determined that the voltage power switch is unlocked (NO at 310), the process proceeds to 312 and the system determines whether the voltage power switch is selected. Specifically, as discussed above in connection with FIG. 1, the system determines whether a SELECTH signal is "HIGH" indicating that a fuse is to be programmed. If at 322, the system determines that the voltage power switch has been selected (YES at 322), the process proceeds to 324 and the voltage power switch outputs a known high voltage for fuse programming. If, on the other hand, the system determines that the voltage power switch has not been selected (NO at 322), the process returns to 312 where a known safe voltage is output from the voltage power switch for regular operation of the IC.

Accordingly, the voltage power switch in accordance with implementations of the subject matter of this disclosure discussed above outputs a known high voltage level suitable for fuse programming as well as outputs a known safe voltage suitable for regular operation of the IC.

Figure 4:
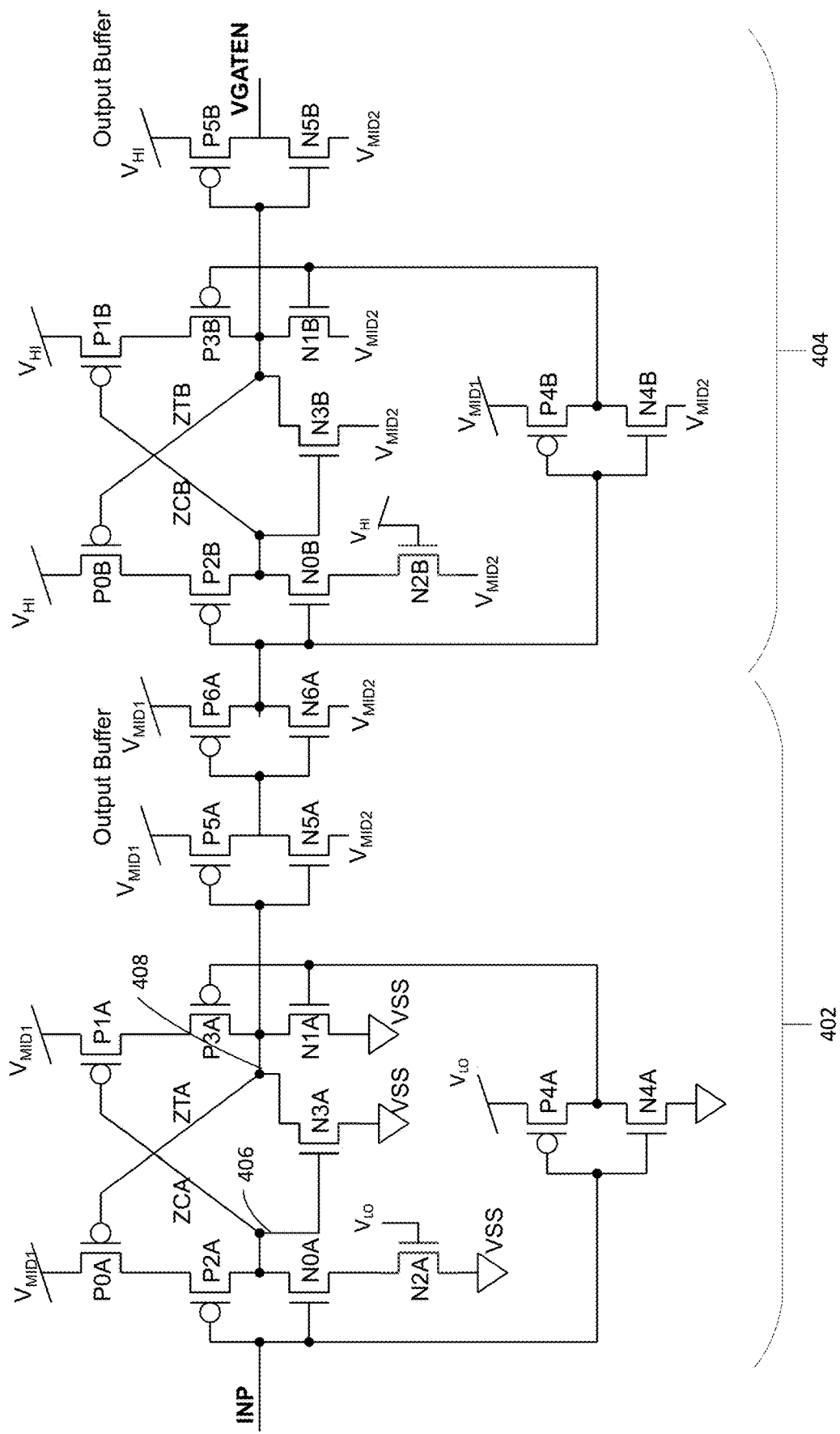
FIG. 4 is a schematic representation of a voltage level shifter in accordance with implementations of the subject matter of this disclosure.

FIG. 4 is a schematic representation of a voltage level shifter in accordance with implementations of the subject matter of this disclosure. Level shifters enable inputs at a lower voltage to be translated into outputs at a higher voltage. However, the transistors in the level shifter are exposed to the higher voltage and must be able to safely operate at these higher voltages. Since $V_{HI}$ in this implementation is higher than the voltages at which the transistors can safely operate, the present disclosure as illustrated in FIG. 4 includes two level shifters 402 and 404 placed in series and are setup to operate at safe voltages.

A low input voltage $V_{LO}$ is input to the first level shifter 402. In conventional level shifters, when the input voltage $V_{LO}$ is 0V (during device power up), the output voltage becomes unknown and therefore undesirable. However, in the embodiment shown in FIG. 4, when the input voltage $V_{LO}$ is 0V, a footer transistor N2A is supplied with a gate voltage equal to the voltage $V_{LO}$. This causes the transistor N2A to be cut off which in breaks the conduction path to ground VSS. With transistor N2A breaking off the connection to the ground VSS, the voltage at node 406 is forced to increase towards a first intermediate voltage $V_{MID1}$. As voltage at node 406 increases towards the first intermediate voltage $V_{MID1}$, a transistor N3A is turned ON (primarily due to leakage) thereby bringing a voltage at node 408 down to 0V. Moreover, as the voltage at node 408 approaches 0V, transistor P0A turns ON thereby reinforcing the voltage at node 406 to increase towards the first intermediate voltage $V_{MID1}$. The first level shifter 402 is therefore configured to level shift between the first intermediate voltage $V_{MID1}$ and a second non-zero intermediate voltage $V_{MID2}$. Next, the second level shifter 404 operates in a similar manner as the first level shifter 402 to level shift between the second non-zero intermediate voltage $V_{MID2}$ and the high voltage $V_{HI}$.

In other words, the first level shifter 402 accepts inputs that operate from a ground voltage VSS (e.g., 0V) to an input low voltage $V_{LO}$ (e.g., 0.75V). These are translated to an output that operates between VSS (e.g., 0V) and $V_{MID1}$ (e.g., 1.2V). That output from the first level shifter 402 goes to a pair of inverters that are connected to the second non-zero intermediate voltage $V_{MID2}$ (e.g., 0.6V) for the low supply and the first intermediate voltage $V_{MID1}$ for the high supply. This limits the voltages going into the second level shifter 404 to be between $V_{MID1}$ and $V_{MID2}$. The second level shifter 404 then generates an output that operates from $V_{MID2}$ (e.g., 0.6V) and $V_{HI}$ (e.g., 1.8V). Node ZCB is therefore at $V_{HI}$ while node ZTB is at $V_{MID2}$ when the voltage power switch is not selected. Similarly, when the switch is selected, node ZCB will be at $V_{MID2}$ and node ZTB will be at $V_{HI}$.

Accordingly, the output VGATEN of the voltage level shifter 122 shifts between two output voltages—second non-zero intermediate voltage $V_{MID2}$ and the high voltage $V_{HI}$. When the output is second non-zero intermediate voltage $V_{MID2}$ the voltage power switch is enabled to pass the fuse programming voltage $V_{HI}$ to the downstream logic. On the other hand, when the output is high voltage $V_{HI}$, the voltage power switch is enabled to pass a known safe voltage—the first non-zero intermediate voltage $V_{MID1}$ to the downstream logic which is safe for all modes of operation.

Figure 5:
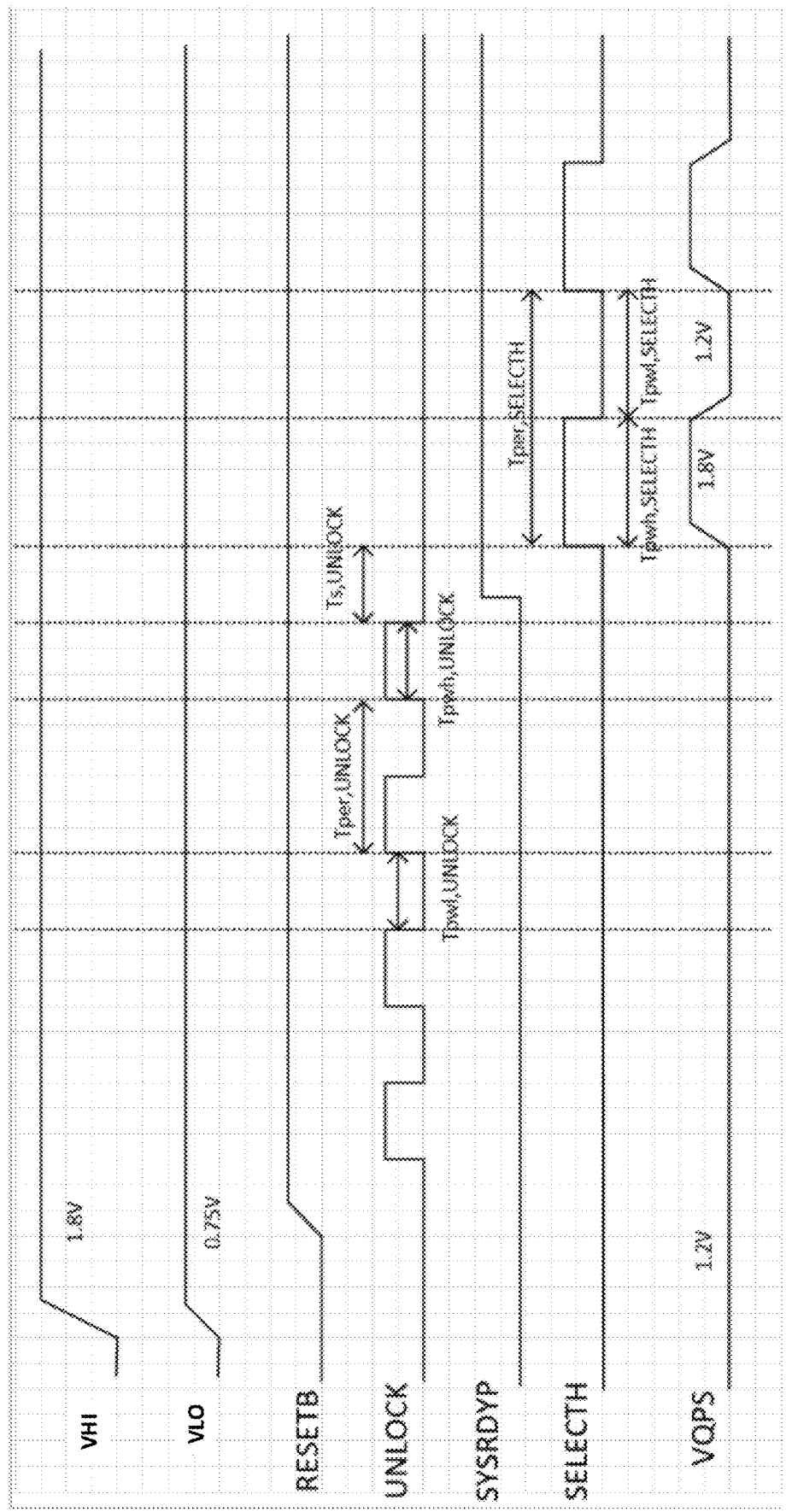
FIG. 5 shows a timing diagram of the various signals in accordance with implementations of the subject matter of this disclosure.

FIG. 5 shows a timing diagram of the various signals in accordance with implementations of the subject matter of this disclosure. Although FIG. 5 discusses specific voltage values, a person skilled in the art will understand that the specific voltage values are shown for illustrative purposes only and that any number of different voltage levels can be supplied based on IC specifications.

As illustrated in FIG. 5, a high voltage $V_{HI}$ can be 1.8V in one embodiment and a low voltage $V_{LO}$ can be 0.75V. The voltages $V_{HI}$ and $V_{LO}$ are brought up during IC power up period. However, as discussed above in connection with FIGS. 1 and 3, because the voltage power switch is in a locked state, the voltages $V_{HI}$ and $V_{LO}$, even when unknown, are not propagated through the IC. The reset signal RESETB generates a pulse as the unknown power supply is being brought up which forces a known locked state into the N latches of the lock circuit.

The lock circuit waits for the unlock signal to unlock the voltage power switch. As illustrated in FIG. 5, the unlock signal is a clock signal pulsed N number of times. Although the embodiment of FIG. 5 shows four clock pulses corresponding to four latches, any number of latches can be included in the lock circuit. Once the valid unlock procedure is performed (i.e., an appropriate number of clock signals are pulsed through), the lock circuit output signal SYSRDYP is set to "HIGH" indicating that the voltage power switch is unlocked. Subsequently, when the voltage power switch is selected for fuse programming (i.e., when the SELECTH signal is "HIGH"), the output voltage VQPS of the voltage power switch outputs the high voltage $V_{HI}$ for fuse programming. As further illustrated in FIG. 5, the voltage power switch outputs a non-zero intermediate voltage $V_{MID1}$ as VQPS at all other times (e.g., while the voltage power switch is in a locked state, or while the SELECTH signal is "LOW") for safe operation of the device.

Accordingly, the voltage power switch guarantees a known safe voltage $V_{MID1}$ as VQPS while the initial voltages $V_{HI}$ and $V_{LO}$ are brought up during IC power up period are unknown by use of the lock circuit. Similarly, a "HIGH" SELECTH signal is also only selected when the voltage power switch is unlocked, thereby preventing the IC from receiving a high voltage during a non-fuse programming period. In this manner, the voltage power switch leverages the lock circuit to guarantee the passing of high voltages for fuse programming only during a specified duration. In one embodiment, the voltage power switch is configured to pass the high voltage during fuse programming for less than 0.2 seconds at a time and less than 10 seconds over the lifetime of a device. By employing the lock circuit and the voltage level shifter to control the voltages passed through to the components of the IC, the voltage power switch is able to increase the lifetime of the device.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A voltage power switch for a semiconductor device, the voltage power switch comprising:
    a lock circuit configured to output a known state; and
    a voltage level shifter configured to receive an input, the input being based on the known state output by the lock circuit; and
    an output circuit configured to output a known voltage level based on an output of the voltage level shifter, wherein the known voltage is one of a high voltage $V_{HI}$ and a first non-zero intermediate voltage $V_{MID1}$.

2. The voltage power switch of claim 1, wherein the voltage level shifter is configured to output the high voltage $V_{HI}$ when the known state output by the lock circuit is a first state, and wherein the voltage level shifter is configured to output a second non-zero intermediate voltage $V_{MID2}$ when the known state output by the lock circuit is a second state.

3. The voltage power switch of claim 2, wherein:
    the output circuit comprises a NMOS transistor and a PMOS transistor; and
    the NMOS transistor and the PMOS transistor are each biased by an output of the voltage level shifter.

4. The voltage power switch of claim 3, wherein the output circuit is configured to (i) output the high voltage $V_{HI}$ when the output from the voltage level shifter is the second non-zero intermediate voltage $V_{MID2}$ and (ii) output the first non-zero intermediate voltage $V_{MID1}$ when the output from the voltage level shifter is the high voltage $V_{HI}$.

5. The voltage power switch of claim 4, wherein the first non-zero intermediate voltage $V_{MID1}$ is higher than the second non-zero intermediate voltage $V_{MID2}$ and is lower than the high voltage $V_{HI}$.

6. The voltage power switch of claim 2, wherein the lock circuit comprises:
    N latches cascaded in series, wherein N is an integer greater than 1; and
    a reset pulse generator configured to force the N latches into a known locked state.

7. The voltage power switch of claim 6, wherein the lock circuit is unlocked by pulsing a clock signal N times.

8. The voltage power switch of claim 6, wherein the lock circuit outputs the first state when the N cascaded latches are in a locked state, and outputs the second state when the N cascaded latches are in an unlocked state.

9. The voltage power switch of claim 2, wherein the voltage level shifter comprises:
    a first stage power-up level shifter configured to receive a logic 1 of amplitude $V_{LO}$ as an input and output the second non-zero intermediate voltage $V_{MID2}$; and
    a second stage power-up level shifter configured to receive the second non-zero intermediate voltage $V_{MID2}$ as an input and output the high voltage $V_{HI}$.

10. The voltage power switch of claim 1, further comprising a digital logic AND gate configured to receive as an input: (i) the known state output from the lock circuit; (ii) a low voltage $V_{LO}$; and (iii) a user generated signal indicative of a fuse programming request.

11. The voltage power switch of claim 10, wherein the voltage level shifter is configured to output the high voltage $V_{HI}$ when the digital logic AND gate is output "LOW" and the voltage level shifter is configured to output a second non-zero intermediate voltage $V_{MID2}$ when the digital logic AND gate is output "HIGH".

12. The voltage power switch according to 1, further comprising an external reset block, wherein the external reset block is configured to generate a reset signal to lock the lock circuit.

13. A method of outputting a known high voltage level for fuse programming, the method comprising:
    generating a reset pulse configured to force a lock circuit into a known locked state;
    generating a predefined clock signal sequence to unlock the lock circuit, where the output of the lock circuit, when in the unlocked state, is a "HIGH" state;
    inputting the output of the lock circuit into a digital logic AND gate;
    receiving a user input signal SELECTH at the digital logic AND gate;
    in response to receiving the user input signal SELECTH and the "HIGH" state output of the lock circuit, outputting a non-zero intermediate voltage $V_{MID2}$ using a voltage level shifter; and
    providing the voltage level shifter output $V_{MID2}$ as a gate voltage to bias a pair of transistors in order to output the known high voltage $V_{HI}$ for fuse programming.

14. The method of claim 13, wherein the lock circuit comprises N latches cascaded in series; and
    wherein unlocking the lock circuit comprises propagating N clock pulses through the lock circuit.

15. The method of claim 13, wherein the known high voltage $V_{HI}$ is output for a short duration.

16. A method of outputting a known safe voltage level, the method comprising:
    generating a reset pulse configured to force a lock circuit into a known locked state, where the output of the lock circuit, when in the locked state, is a first "LOW" state;
    inputting the output of the lock circuit into a digital logic AND gate such that the digital logic AND gate outputs a "LOW" state independent of additional inputs to the digital logic AND gate;
    outputting, at an output node of a voltage level shifter, a high voltage $V_{HI}$ in response to receiving an output "LOW" from the digital logic AND gate; and
    providing the voltage level shifter output $V_{HI}$ as a gate voltage to bias a pair of transistors in order to output the known safe voltage.

17. The method of claim 16, wherein the additional inputs to the digital logic AND gate are unknown.

18. The method of claim 17, wherein the additional inputs to the digital logic AND gate include a power-on voltage.

19. The method of claim 16, wherein the lock circuit includes N latches cascaded in series; and
wherein the N latches remain in a locked state until receiving N number of clock pulses.

20. The method of claim 16, wherein the known safe voltage is output for a duration of a non-fuse programming period.

\* \* \* \* \*